United States Patent
Shoval

[11] Patent Number: 6,049,300
[45] Date of Patent: Apr. 11, 2000

[54] DIFFERENTIAL RESISTOR-STRING DIGITAL TO ANALOG CONVERTER

[75] Inventor: Ayal Shoval, Whitehall, Pa.

[73] Assignee: Lucent Technologies Inc.

[21] Appl. No.: 09/038,423

[22] Filed: Mar. 11, 1998

[51] Int. Cl.[7] .............................. H03M 1/66; H03M 3/00

[52] U.S. Cl. ........................................... 341/144; 341/143

[58] Field of Search ...................................... 341/144, 145, 341/118, 133, 155, 143, 154; 338/295

[56] References Cited

U.S. PATENT DOCUMENTS

| | | | |
|---|---|---|---|
| 5,293,148 | 3/1994 | Hancock | 338/295 |
| 5,396,245 | 3/1995 | Rempfer | 341/145 |
| 5,627,537 | 5/1997 | Quinlan et al. | 341/144 |
| 5,729,231 | 3/1998 | Kikuchi | 341/144 |
| 5,841,384 | 11/1998 | Herman et al. | 341/144 X |

*Primary Examiner*—Brian Young
*Assistant Examiner*—Patrick Wamsley

[57] ABSTRACT

A resistor-string DAC employing resistors of different value and a switching circuit for producing a differential analog voltage output which can be shaped with respect to an arbitrary common-mode voltage.

20 Claims, 3 Drawing Sheets

TABLE 1

TABLE 2

DIFFERENTIAL RESISTOR-STRING DIGITAL TO ANALOG CONVERTER

FIELD OF INVENTION

The present invention is directed generally towards digital to analog converters (DACs), and more particularly towards a resistor-string digital to analog converter.

BACKGROUND OF THE INVENTION

Digital to analog converters are widely used today in mixed-mode systems requiring monotonicity where the converter acts as an interface between the digital signal processing and analog signal processing components of such systems. Such converters are commonly used for tuning continuous time filters where a tuning algorithm is implemented in the digital domain and analog voltages based on the tuning algorithm must be obtained to tune the filter. Analog signal processing typically makes use of adaptive or programmable circuits which are tuned in the digital domain during operation to provide optimum performance.

Differential DACs are often employed in high-speed, mixed-mode systems to reduce the electronic noise produced by such systems. Specifically, a differential DAC reduces the common-mode voltage noise thereby enhancing the performance of the system. Differential DACs can be used to control equalizer filter coefficients and to provide a differential offset voltage for DC offset compensation.

Conventional resistor-string DACs of the type shown in FIG. 1 are well known in the art. DAC 10 is comprised of resistors $R_1$ through $R_n$ which are of equal value and are coupled together in series. $B_{[N:1]}$ represents N digital bits, and $V_{REFP}$ and $V_{REFN}$ represent positive and negative reference voltages, respectively. DAC 10 produces a linear output as a function of the binary digital word $D=[B_N, B_{N-1} \ldots B_2, B_1]$, which is input into DAC 10. N bits produce $2^{n-1}$ outputs. Output multiplexor 11, which is controlled by $B_n$, controls the sign of the differential output voltage $v_{od}$. Decoder block 12 is used to produce a signal to control switches $S_{[L:0]}$, where $L=2^{N-1}-1$. Exclusive OR gates 13 are used to condition bits $B_{[N-1:1]}$ so that as the counter which produces D increments or decrements, a continuous sweep of the output voltage is attained. This conditioning is achieved by decoder block 12. TABLE 1 analyzes DAC 10 when N=3 and switch $S_i$ is closed.

Conventional resistor-string DAC circuits of the type shown in FIG. 1 suffer from several drawbacks. First, the output voltage is linear and can not be shaped, thus limiting the ability to use the DAC to tune a filter. Second, the output is dependent on the value of the reference voltages $V_{REFP}$ and $V_{REFN}$ which are sometimes difficult to generate. Third, the common-mode voltage cannot be arbitrarily set, but depends on $V_{REFP}$, $V_{REFN}$ and the resistor values.

SUMMARY

In accordance with the present invention there is provided a resistor-string DAC employing a switching circuit for producing a differential analog output voltage which can be nonlinear and which is referenced to an arbitrary common-mode voltage.

BRIEF DESCRIPTION OF THE DRAWINGS

A more complete understanding of the present invention may be obtained from consideration of the following description in conjunction with the drawings in which.

DETAILED DESCRIPTION OF THE INVENTION

Figure 2:
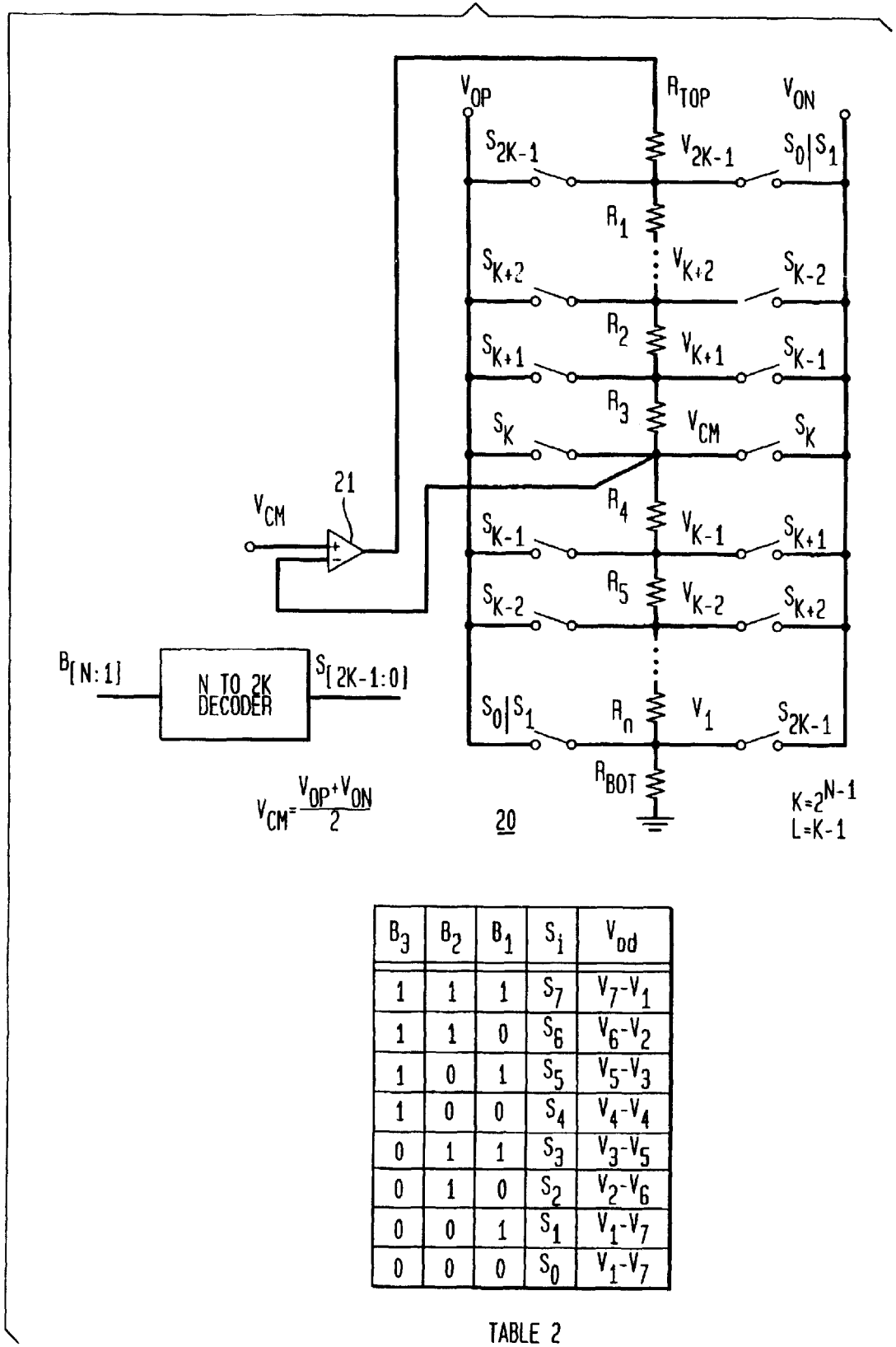
FIG. 2 shows an exemplary embodiment of a differential resistor-string DAC for producing a differential output voltage which can be shaped with respect to an arbitrary common-mode voltage according to this invention.

Referring to FIG. 2 there is shown an exemplary embodiment of a differential resistor-string DAC 20 according to the present invention. DAC 20 is comprised of resistors $R_1$, $R_2, R_3 \ldots R_L$ which are coupled together in series. Resistors $R_1, R_2, R_3 \ldots R_L$ are of varying value and are represented by R[L:1]. DAC 20 enables arbitrary wave shaping to be obtained as a function of the binary digital word $D=[B_n, B_{N-1} \ldots B_2, B_1]$, which is input into DAC 20. Each resistor tap in DAC 20 is coupled to two switches, with the control signals to the switches, on opposite sides of the resistor taps, being flipped. DAC 20 produces a differential output voltage owing to the configuration of the switches. As the i-th switch from the top of the resistor-string makes contact with $v_{op}$, the i-th switch from the bottom of the resistor-string makes contact with $v_{on}$. The resultant output $v_{od}=v_{op}-v_{on}$ is a differential voltage about the common-mode voltage $V_{CM}=(v_{op}+v_{on})/2$ for every switch i that is active. Operational amplifier 21 is used to produce the common-mode voltage $V_{CM}$. The i-th switch which is active depends on the input word D. Table 2 analyzes DAC 20 for the case here N=3. DAC 20 can, however, operate on words D comprised of up to 10 bits.

Figure 1:
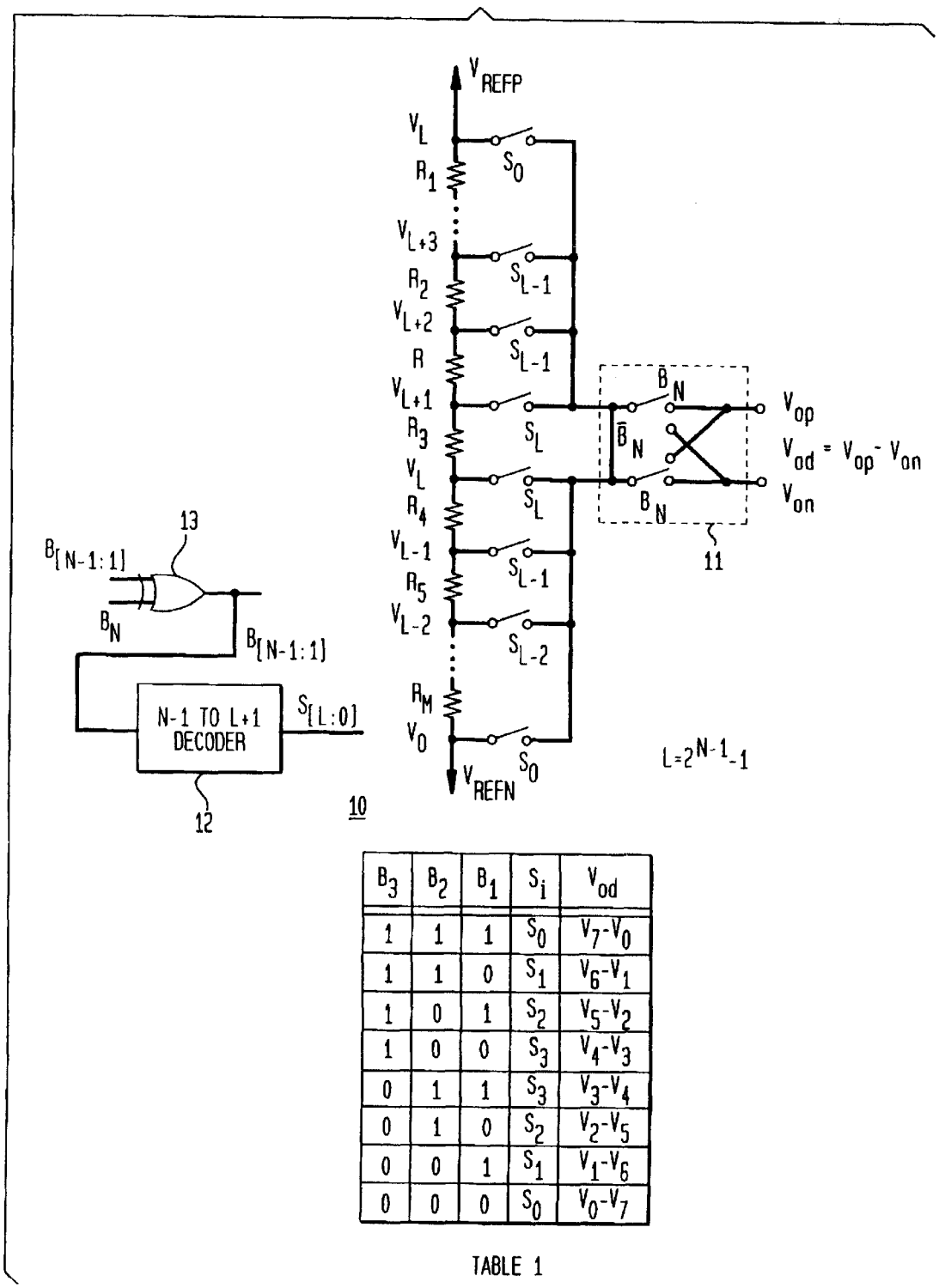
FIG. 1 shows a conventional resistor-string DAC which produces a differential output voltage.
Figure 3:
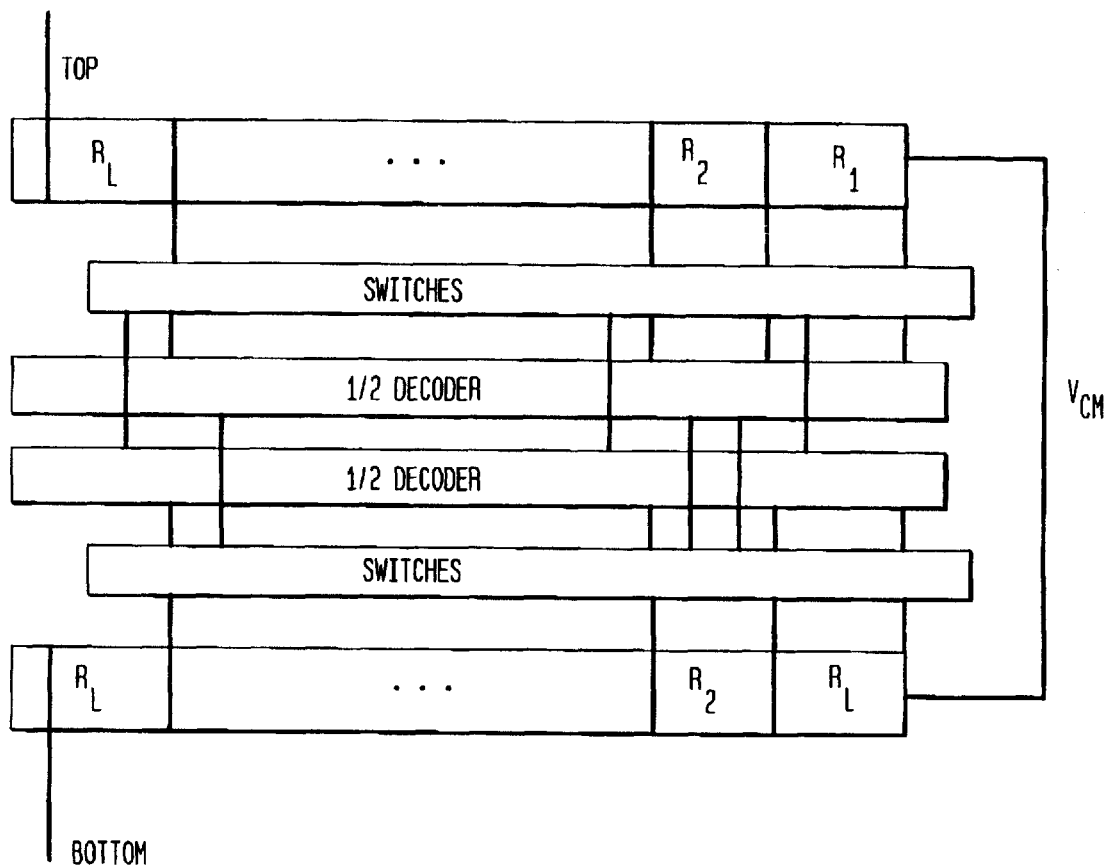
FIG. 3 shows an exemplary layout of the differential resistor-string DAC shown in FIG. 2.

Employing the architecture shown in FIG. 2 produces a symmetric DAC wave shape about the common-mode voltage $V_{CM}$ over the full range of digital word D. $S_0$ and $S_1$ are "OR"-ed so that a symmetric bipolar output is attained. Although resistors $R_1, R_2, R_3 \ldots R_L$ of DAC 20 are each coupled to two switches, DAC 20 can be fabricated so that these resistors are each coupled to a single switch in the same manner as the resistors of conventional DAC 10 shown in FIG. 1. In the case where the layout of R1:RL is one body of resistor material with taps, the decoder can be two identical rows of digital gates that fit between the two major resistor subsections of DAC 20 as illustrated in FIG. 3. The resolution or accuracy of DAC 20 will depend on how well resistors $R_1$ through $R_L$ match when fabricated on a chip. At present, tolerances of approximately 0.1% can be attained for 10 bit words.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications, which come within the scope of the appended claims, is reserved.

What is claimed is:

1. An integrated circuit having a differential resistor-string digital to analog converter, comprising:
    a voltage source; and
    a switching circuit coupled to said voltage source, wherein said switching circuit includes a plurality of resistors coupled to one another in series, said digital to analog converter being configured for producing an arbitrary differential analog output voltage which is referenced to a common mode voltage.

2. The integrated circuit resistor-string digital to analog converter according to claim 1, wherein said switching circuit includes a plurality of switches and each one of said plurality of resistors is coupled to at least a different one of said plurality of switches.

3. The integrated circuit according to claim 2, wherein said voltage source is an operational amplifier.

4. The integrated circuit according to claim 3, wherein said operational amplifier generates said common-mode voltage.

5. The integrated circuit according to claim 4, wherein said output voltage is shaped as a function of a binary digital word converted by said resistor-string digital to analog converter.

6. The integrated circuit according to claim 5, wherein a symmetric shape is obtained about said common-mode voltage over the full range of said digital word.

7. The integrated circuit according to claim 5, wherein said digital word is comprised of ten bits.

8. The integrated circuit according to claim 4, wherein said output voltage is a differential voltage about said common-mode voltage for each one of said plurality of switches that is closed.

9. The integrated circuit according to claim 1, wherein said resistor-string digital to analog converter is used to tune a filter.

10. The integrated circuit resistor-string digital to analog converter according to claim 1, wherein said converter is used to produce a differential offset voltage used for DC offset compensation.

11. The integrated circuit resistor-string digital to analog converter according to claim 1, wherein said switching circuit includes a plurality of switches and each one of said plurality of resistors is coupled to two different ones of said plurality of switches.

12. The integrated circuit resistor-string digital to analog converter according to claim 1, wherein each one of said resistors are of a different value.

13. The integrated circuit according to claim 1, wherein said resistor-string digital to analog converter includes a decoder block for producing a signal to switch said plurality of switches.

14. The integrated circuit according to claim 1, wherein said output voltage is nonlinear.

15. A resistor-string digital to analog converter, comprising:

a voltage source; and a switching circuit coupled to said voltage source, wherein said switching circuit includes a plurality of resistors coupled to one another in series and further includes a plurality of switches, each one of said plurality of resistors being coupled to at least a different one of said plurality of switches and said digital to analog converter being configured for producing an arbitrary differential analog output voltage which is referenced to a common mode voltage.

16. The resistor-string digital to analog converter according to claim 15, wherein said switching circuit includes a plurality of switches and each one of said plurality of resistors is coupled to two different ones of said plurality of switches.

17. The resistor-string digital to analog converter according to claim 15, wherein each one of said resistors are of a different value.

18. The resistor-string digital to analog converter according to claim 15, wherein said voltage source is an operational amplifier, said operational amplifier generating a common-mode voltage, and said output voltage being a differential voltage about said common-mode voltage for each one of said plurality of switches that is closed.

19. The resistor-string digital to analog converter according to claim 15, wherein said output voltage is nonlinear.

20. A method of generating a differential analog output voltage from a resistor-string digital to analog converter, comprising the steps of:

providing a switching circuit including a plurality of resistors coupled to one another in series and further including a plurality of switches, each one of said plurality of resistors being coupled to at least a different one of said plurality of switches;

generating a voltage to switch said switching circuit and produce an analog output voltage, which output voltage can be used to tune a filter.

* * * * *